US009026890B2

(12) United States Patent
Confalonieri et al.

(10) Patent No.: US 9,026,890 B2
(45) Date of Patent: *May 5, 2015

(54) MEMORY WITH GUARD VALUE DEPENDENT ERROR CORRECTION

(71) Applicant: Micron Technology, Inc., Boise, ID (US)

(72) Inventors: Emanuele Confalonieri, Lesmo (IT); Sara Villa, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/166,724

(22) Filed: Jan. 28, 2014

(65) Prior Publication Data

US 2014/0149823 A1 May 29, 2014

Related U.S. Application Data

(63) Continuation of application No. 12/336,476, filed on Dec. 16, 2008, now Pat. No. 8,645,792.

(51) Int. Cl.
*G06F 11/00* (2006.01)
*G06F 11/10* (2006.01)
*H03M 13/11* (2006.01)
*G11C 29/04* (2006.01)

(52) U.S. Cl.
CPC ........ *G06F 11/1008* (2013.01); *G06F 11/1068* (2013.01); *G06F 11/1072* (2013.01); *H03M 13/1105* (2013.01); *G11C 2029/0411* (2013.01)

(58) Field of Classification Search
CPC ............ G06F 11/1076; G06F 11/1008; G06F 11/1068
USPC .......................................................... 714/763
See application file for complete search history.

(56) References Cited

U.S. PATENT DOCUMENTS

| | | | | |
|---|---|---|---|---|
| 3,573,728 | A * | 4/1971 | Kolankowsky et al. ....... | 714/764 |
| 6,731,557 | B2 * | 5/2004 | Beretta .......................... | 365/222 |
| 6,958,949 | B2 * | 10/2005 | Confalonieri et al. ... | 365/230.06 |
| 8,111,554 | B2 * | 2/2012 | Lutze ........................ | 365/185.19 |
| 8,522,121 | B2 * | 8/2013 | Zopf ............................ | 714/785 |
| 2003/0012064 | A1 * | 1/2003 | Beretta .......................... | 365/200 |
| 2003/0149831 | A1 * | 8/2003 | Confalonieri et al. ........ | 711/100 |
| 2006/0259847 | A1 * | 11/2006 | Villa ............................. | 714/758 |
| 2007/0277060 | A1 * | 11/2007 | Cornwell et al. ............... | 714/54 |
| 2008/0212369 | A1 * | 9/2008 | Turbanti et al. .......... | 365/185.03 |
| 2008/0282106 | A1 * | 11/2008 | Shalvi et al. ...................... | 714/6 |
| 2009/0129169 | A1 * | 5/2009 | Roohparvar et al. .... | 365/185.21 |
| 2010/0070798 | A1 * | 3/2010 | Cornwell et al. ................. | 714/5 |
| 2011/0044742 | A1 * | 2/2011 | Thayer et al. ................. | 399/346 |
| 2011/0066902 | A1 * | 3/2011 | Sharon et al. ................. | 714/721 |
| 2011/0083050 | A1 * | 4/2011 | Aritome ....................... | 714/721 |
| 2011/0141818 | A1 * | 6/2011 | Li ............................. | 365/185.22 |
| 2011/0182121 | A1 * | 7/2011 | Dutta et al. .............. | 365/185.09 |
| 2011/0185251 | A1 * | 7/2011 | d'Abreu et al. ............... | 714/752 |
| 2012/0240012 | A1 * | 9/2012 | Weathers et al. ............. | 714/773 |
| 2012/0266046 | A1 * | 10/2012 | Thatcher et al. ............. | 714/763 |
| 2012/0272122 | A1 * | 10/2012 | Perlmutter et al. ........... | 714/763 |
| 2012/0324313 | A1 * | 12/2012 | Mittelholzer et al. ........ | 714/763 |
| 2014/0164879 | A1 * | 6/2014 | Tam ............................. | 714/773 |
| 2014/0237326 | A1 * | 8/2014 | Roohparvar et al. ......... | 714/795 |

* cited by examiner

*Primary Examiner* — Amine Riad
(74) *Attorney, Agent, or Firm* — Knobbe, Martens, Olson & Bear LLP

(57) ABSTRACT

Embodiments of the present disclosure provide methods, systems, and apparatuses related to calculating an error correction code for a program page dependent on guard values that correspond to words of the program page. Other embodiments may be described and claimed.

26 Claims, 7 Drawing Sheets

MEMORY WITH GUARD VALUE DEPENDENT ERROR CORRECTION

FIELD

Embodiments of the present disclosure relate to the field of memory, and more particularly, to memory with guard value dependent error correction.

BACKGROUND

Advances in non-volatile memory (NVM) are reducing the size of individual memory cells and enabling some memory cells, referred to as multilevel cells, to represent more than two states. Each state of a multilevel cell is associated with a corresponding logic value and is defined by a respective range of a specific physical quantity, e.g., a voltage. Each of these advances is associated with its own reliability issues. For example, increasing the number of possible states for a multilevel cell involves a reduction of the voltage ranges between each logic value, which makes the device more sensitive to noise. For another example, reducing the size of the memory cell may be associated with issues relating to retention, drain disturbances, floating gate coupling, etc.

Control codes, e.g., error correction codes (ECCs), have been used to improve the reliability of these advanced NVM devices. ECCs add redundant information to every predetermined set of bits, e.g., a page. Such redundant information is used to detect and correct, if possible, any errors in the page. This allows some defective cells to be accepted in the memory device without jeopardizing its operation. In this way, the production cost of the memory device can be significantly reduced.

Using known techniques to embed ECCs into NVM devices may limit subsequent manipulation of data. For example, NVM such as flash memory cannot program a "1" data on a selected cell with "0" content without erasing and rewriting a whole block of data. As a consequence, manipulation of the ECC bits and page data may be severely restricted.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means "(A), (B), or (A and B)." For the purposes of the present disclosure, the phrase "A, B, and/or C" means "(A), (B), (C), (A and B), (A and C), (B and C), or (A, B and C)."

Various logic blocks may be introduced and described in terms of an operation provided by the blocks. These logic blocks may include hardware, software, and/or firmware elements in order to provide the described operations. While some of these logic blocks may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
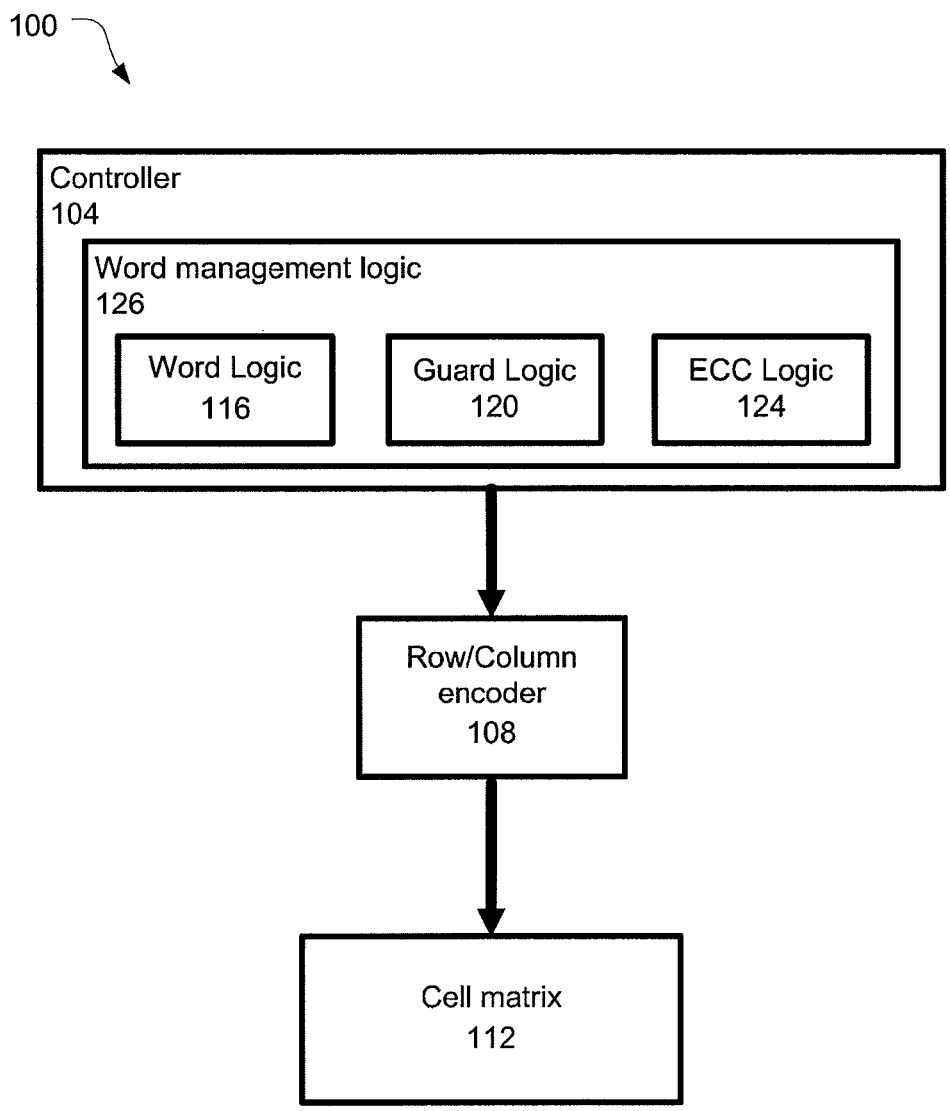
FIG. 1 illustrates an NVM device in accordance with embodiments of this disclosure.

FIG. 1 illustrates an NVM device 100 in accordance with some embodiments. The NVM device 100 may include a controller 104 that controls a row/column encoder 108 to write data into a cell matrix 112. The cell matrix 112 may be a matrix of memory cells that are each formed by a floating gate metal oxide semiconductor (MOS) transistor. In other embodiments, other transistor or transistor-like technologies may be used. The memory cells may be single-level or multilevel memory cells.

Data stored in the cell matrix 112 may be organized as a collection of bits that make up words, with a collection of words that make up a program page, or simply "page." An ECC may be calculated on each page. Given an "n" bit page, an ECC of "m" bits may be desired. The relationship between "n" and "m" may depend on the number of errors to be detected/corrected and may differ in various embodiments.

In various embodiments, a guard field may be associated with each word of a page. Values within these guard fields may be used in the calculation of an ECC value for the page in a manner that may allow for subsequent bit manipulation of data within the page without having to engage in a block rewrite.

The controller 104 may include word logic 116, guard logic 120, and ECC logic 124 configured to manage the words, guard fields, and ECC fields, respectively, as will be described. The word logic 116, guard logic 120, and ECC logic 124 may be collectively referred to as word management logic 126.

Figure 2:
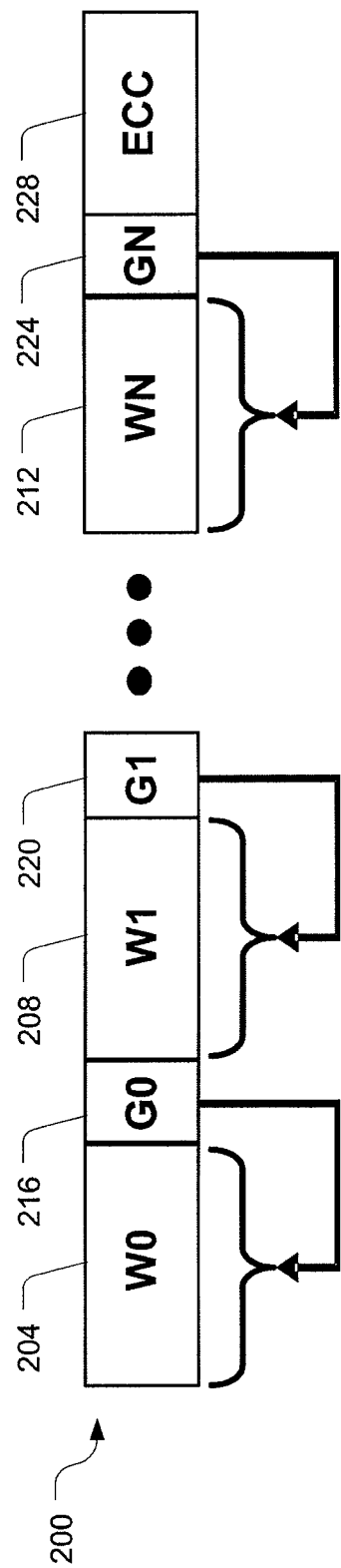
FIG. 2 illustrates a page in accordance with embodiments of this disclosure.

FIG. 2 illustrates a page 200 in accordance with various embodiments. The page 200 may include words W0 204, W1 208, ... WN 212, to store data, respectively associated with guard fields G0 216, G1 220, ... GN 224, to store guard values that correspond to the associated words. The page 200 may have an ECC field 228 to store an ECC value that corresponds to the data stored in at least some of the words of the page 200.

Figure 3:
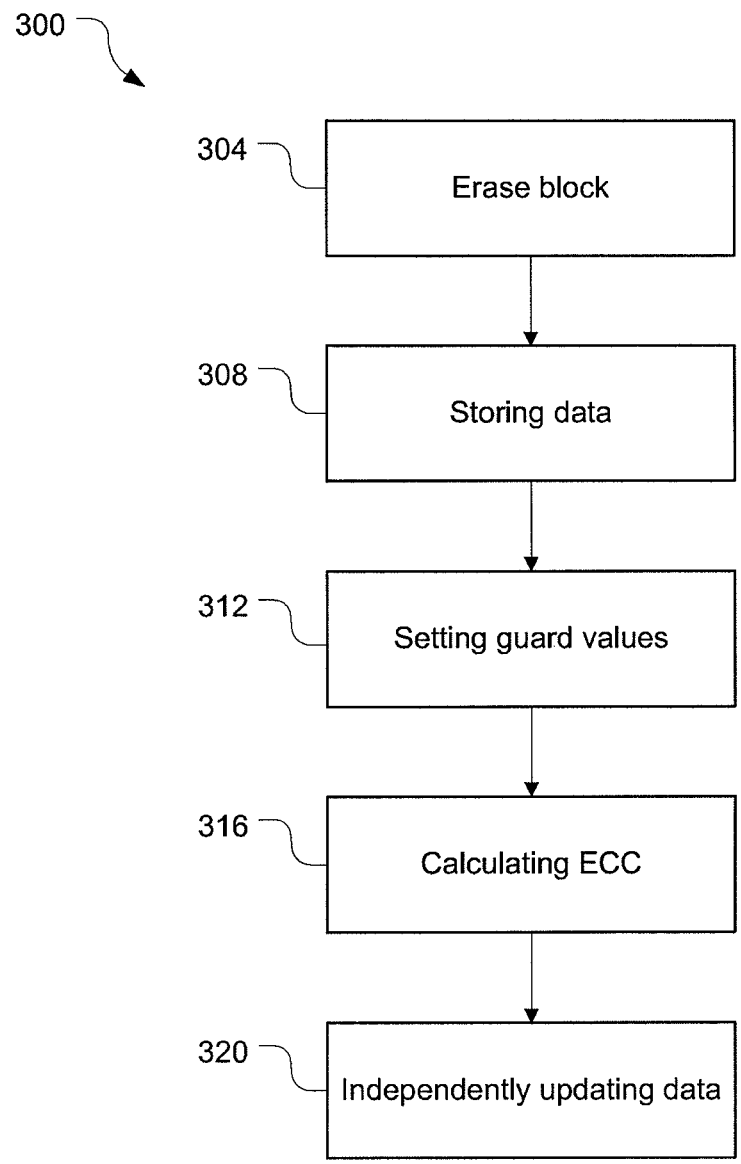
FIG. 3 is a flowchart depicting operation of an NVM device in accordance with embodiments of this disclosure.

FIG. 3 is a flowchart describing operation of the NVM device 100 in accordance with various embodiments.

The controller 104 may erase a block of memory cells at 304. An erase operation of the NVM device 100 may set all the bits of the block to one.

At 308, the word logic 116 may store data into words of a page of words of the NVM device 100. The word logic 116 may store the data into the words by performing various writing, or programming, operations on selected words.

At 312, the guard logic 120 may set guard values and store the guard values in the guard fields associated with the words. Setting a guard value for each word of the page may allow the ECC to selectively cover the words. This may, in turn, allow for independent updating of the data in selected words of the page.

At 316, the ECC logic 124 may calculate an ECC value for the page and store the ECC value in the ECC field 228. In the calculation of the ECC value, the ECC logic 124 may determine whether the guard value is set in an enabled state or a disabled state. If the guard value is set in an enabled state, the ECC logic 124 may use the actual value of the corresponding word in the ECC calculation. That is, ECC coverage of the word is enabled. If the guard value is set to a disabled state, the ECC logic 124 may use a mask value in place of the actual value of the corresponding word in the ECC calculation.

At 320, the word logic 116 may independently update data within one or more of the words that are associated with a guard value that is set to a disabled state. As used herein, "independently updating data" means that data of a particular word or words of a page may be updated without rewriting data within other words of the same page.

Figure 4:
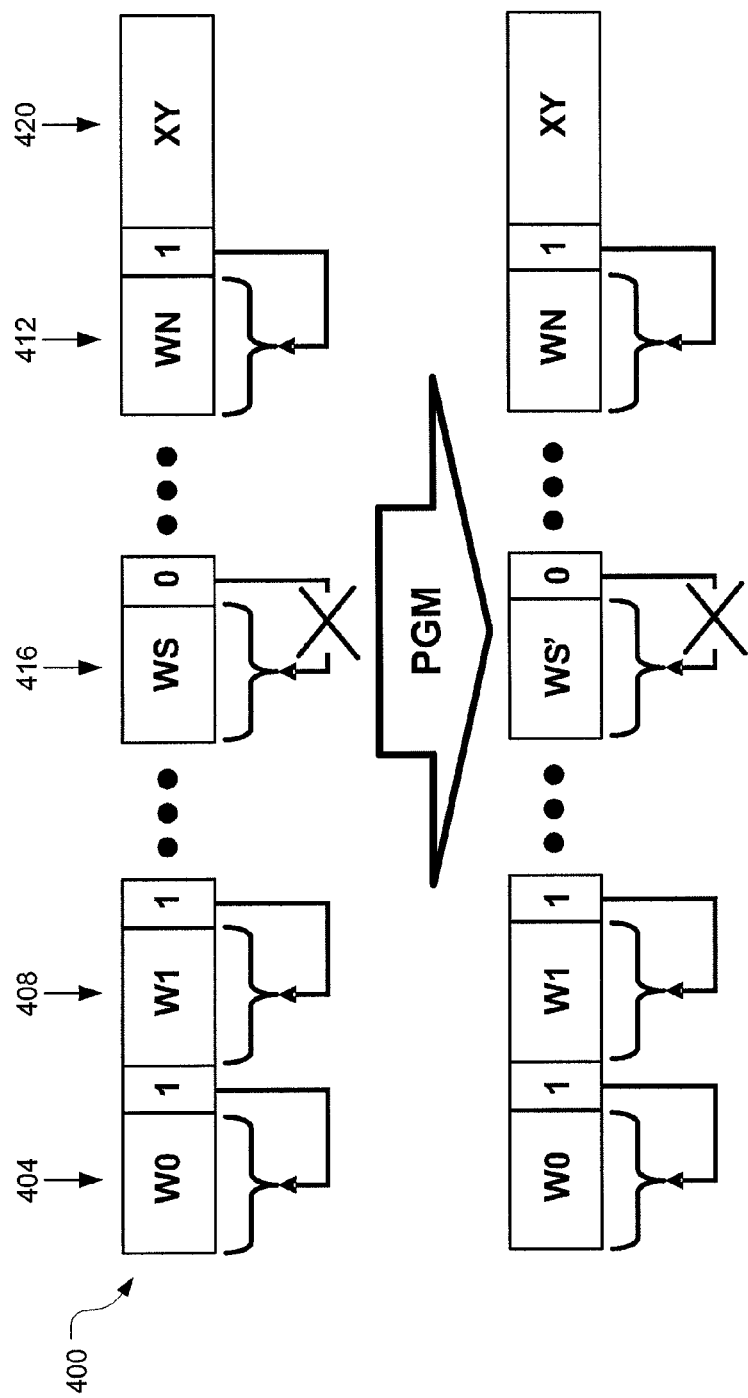
FIG. 4 illustrates a programming operation of a page in accordance with embodiments of this disclosure.

FIG. 4 illustrates an independent updating operation in accordance with some embodiments. In this embodiment, page 400 may have guard values set in an enabled state, e.g., one in this example, for words W0 404, W1 408, and WN 412. Word WS 416 may have a guard value set in a disabled state, e.g., zero in this example. Accordingly, the value XY of the ECC field 420 may not cover the word WS 416. Therefore, the word WS 416 may be independently updated in a programming operation to have a new value, represented by WS', without the ECC value changing, which may not be permissible in the NVM device 100 without a block rewrite. In this manner, subsequent independent updating of words not covered by the ECC value may not compromise the ability of the ECC value to identify errors in the words that are covered.

Figure 5:
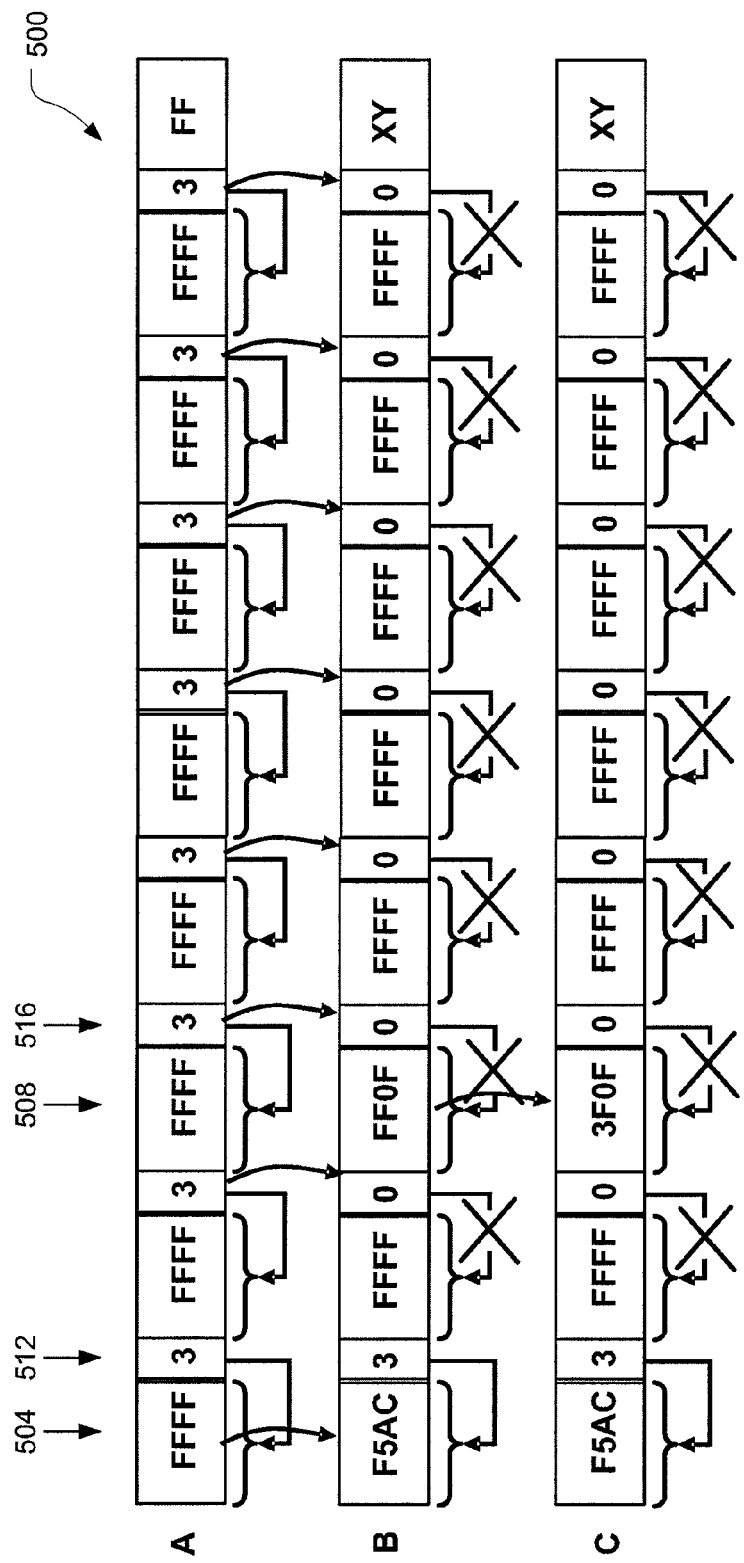
FIG. 5 illustrates a programming operation of a page in accordance with embodiments of this disclosure.

FIG. 5 illustrates programming operations of a page 500 in accordance with some embodiments. Page 500 may include eight words, with each word having eight, two-bit memory cells. Each of the four characters shown in the words and the two characters shown in the ECC field may represent a value, in a hexadecimal format, provided by a pair of memory cells. The characters shown in the guard fields may represent a value provided by a single memory cell. It may be noted that the provided details, e.g., the number of bits per word, words per page, and/or bits per memory cell, are presented only to facilitate description. Other embodiments may use other details.

Page 500 is shown in FIG. 5 in three conditions: A, B, and C. Condition A may be an erase condition, with all of the bits set to "1," which may result in the "F's" of the words and the ECC field and the "3" of the guard fields. Conditions B and C may represent the page 500 after successive programming iterations.

In this embodiment, a guard value of "3" may be considered an enabled state and a guard value of "0" may be considered a disabled state. It may be noted that while this embodiment contemplates two states of enablement, other embodiments may use other guard values to represent additional states of enablement, e.g., partially enabled states.

The second condition B may result from a first programming iteration in which a first word 504 and a third word 508 are updated, e.g., programmed. The first word 504 may be programmed from "FFFF" to "F5AC," the third word 508 may be programmed from "FFFF" to "FF0F," and the remaining words may remain unprogrammed.

In this embodiment, the guard fields corresponding to the second through eighth words may be programmed to the disabled status, while the guard field 512 associated with the first word 504 may remain set at the enabled status. Thus, the ECC value, given as "XY" in condition B, may only cover the first word 504. A mask value, e.g., "FFFF," may be used in the ECC calculation for each word whose guard field is in a disabled state, e.g., the second through eighth words. In the subsequent programming iteration that results in condition C, any of the words whose guard fields are set to a disabled state may be updated without having to change the ECC value. For example, the third word 508 may be updated from "FF0F" to "3F0F" in the second programming iteration, but because it is not covered by the ECC, the ECC value does not change.

It may be noted that while both the first word 504 and the third word 508 are programmed in the first programming iteration, only the guard field 512 remains in the enabled state. This may be due to differences in the content of the corresponding words in condition B.

The first word 504 and the third word 508 may both have single-level content (SLC), e.g., "FFFF," in condition A. A word may have SLC when all of the bits of a given pair of memory cells have the same value, e.g., "1" or "0."

The first programming iteration may involve a multilevel programming operation with respect to the first word 504, which results in multilevel content (MLC), e.g., "F5AC," in condition B. A word may have MLC when at least two of the bits of a given pair of memory cells have different values.

The first programming iteration may also involve a single level programming operation with respect to the third word 508, which results in single-level content, e.g., "FF0F," in condition B.

In this embodiment, the setting of the guard value may be based at least in part on whether a corresponding word has SLC or MLC. For example, guard field 512, which is associated with first word 504, may have a guard value set to the enabled state, "3," in condition B due to its MLC. Conversely, guard field 516, which is associated with third word 508, may have a guard value set to the disabled state, "0," in condition B due to its SLC.

In some embodiments, applications accessing the NVM device 100 may save data as SLC (or MLC) words based on whether it will be desirable for the data to be independently updateable. For example, an application may store metadata in an SLC form due to its high likelihood that it will need to be updated. With the metadata stored in the words as SLC, it may not be covered by the ECC and, therefore, may be manipulated on a bit basis.

Figure 6:
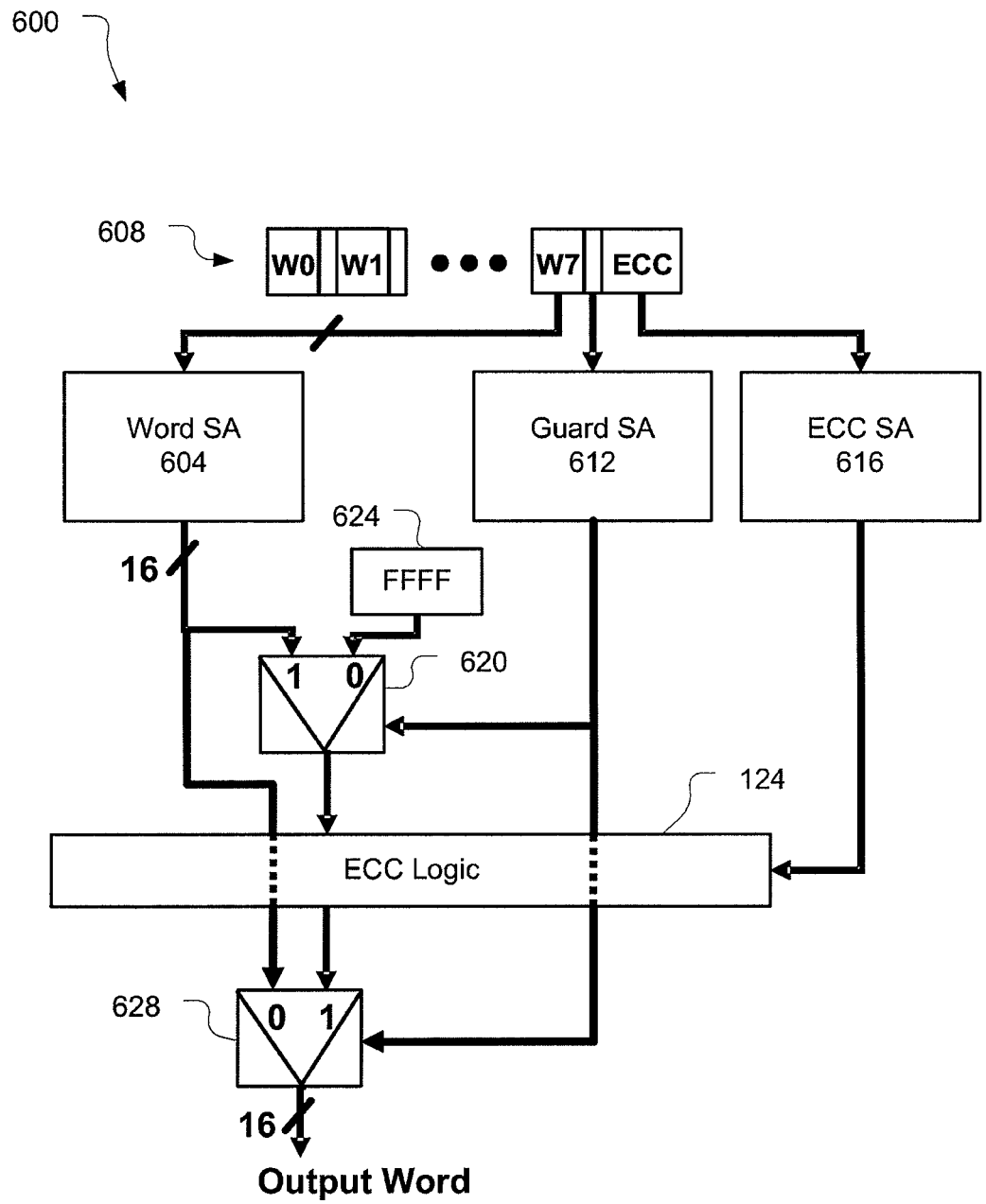
FIG. 6 illustrates read components of an NVM device in accordance with embodiments of this disclosure.

FIG. 6 illustrates read components 600 that may be used in the NVM device 100 in accordance with various embodiments. The read components 600 may include a word sense amplifier (SA) 604 to read word values from a page 608; a guard SA 612 to read guard values from the page 608; and an ECC SA 616 to read the ECC value of the page 608.

The word SA 604 and the guard SA 612 may be coupled to a selector 620. The selector 620 may receive the word value from the word SA 604; a mask value (e.g., "FFFF") from register 624; and a guard value from the guard SA 612. Depending on whether the guard value represents an enabled or disabled state, the selector 620 may transmit the word value or the mask value to ECC logic 124.

The ECC logic 124, in addition to receiving a value from the selector 620, may receive an ECC value from the ECC SA 616. The ECC logic 124 may verify the accuracy of the covered words of the page 608 and, whenever possible, correct words that are determined to have inaccurate information.

A selector 628 may be coupled to the word SA 604, the ECC logic 124, and the guard SA 612 and may output words. Depending on whether the guard state is enabled or disabled, the output word will come from the word SA 604 or the ECC logic 124. For example, if the guard bit of a word is 0, ECC coverage on that word may be disabled and the output word may come directly from the word SA 604 and, if the guard bit is 1, ECC coverage may be active on that word and the output word may come from ECC logic 124.

Figure 7:
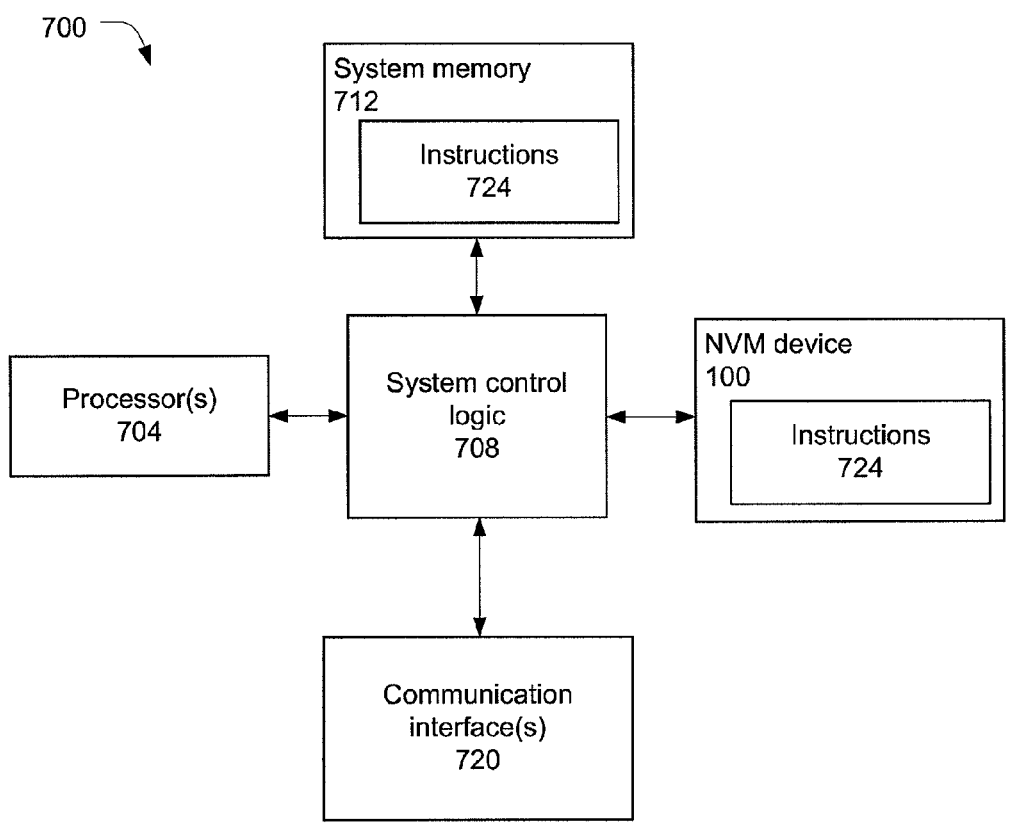
FIG. 7 illustrates a host device incorporating an NVM device in accordance with embodiments of this disclosure.

FIG. 7 illustrates a host device 700 that may host the NVM device 100 in accordance with some embodiments. The host device 700 may include one or more processors 704, system control logic 708 coupled to at least one of the processor(s) 704, system memory 712 coupled to the system control logic 708, the NVM device 100 coupled to the system control logic 708, and one or more communications interfaces 720 coupled to the system control logic 708.

System control logic 708 for one embodiment may include any suitable interface controllers to provide for any suitable interface to the components with which it is coupled.

System memory 712 may be used to load and/or store data/instructions, for example, for the host device 700. System memory 712 may include any suitable volatile memory, such as, but not limited to, suitable dynamic random access memory (DRAM).

The NVM device 100 may be used to load and/or store data/instructions, for example. The NVM device 100 may include any suitable non-volatile memory, such as, but not limited to, NOR flash memory, NAND flash memory, phase change memory, etc.

In some embodiments, the word management logic 126 may include instructions 724 that when executed by the processor(s) 704 result in the host device 700 performing at least some of the word management operations described herein. The instructions may be located in the NVM device 100 and/or the system memory 712. In some embodiments, the instructions 724 may additionally/alternatively be located in the system control logic 708.

Communications interface(s) 720 may provide an interface for the host device 700 to communicate over one or more networks and/or with any other suitable device. Communications interface(s) 720 may include any suitable hardware and/or firmware. Communications interface(s) 720 for one embodiment may include, for example, a network adapter, a wireless network adapter, a telephone modem, and/or a wireless modem. For wireless communications, communications interface(s) 720 for one embodiment may use one or more antennas.

For one embodiment, at least one of the processor(s) 704 may be packaged together with logic for one or more controllers of system control logic 708. For one embodiment, at least one processor of the processor(s) 704 may be packaged together with logic for one or more controllers of system control logic 708 to form a System in Package (SiP). For one embodiment, at least one processor of the processor(s) 704 may be integrated on the same die with logic for one or more controllers of system control logic 708. For one embodiment, at least one processor of the processor(s) 704 may be integrated on the same die with logic for one or more controllers of system control logic 708 to form a System on Chip (SoC).

In various embodiments, the host device 700 may be a desktop or laptop computer, a server, a set-top box, a digital recorder, a game console, a personal digital assistant, a mobile phone, a digital media player, a digital camera, etc. The host device 700 may have more or less components and/or different architectures.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A method of calculating an error correction code for a page of a non-volatile memory, the method comprising:
   storing a plurality of words on the page, each word of the plurality of words containing a corresponding actual value and having a corresponding guard value in one of at least two states; and
   calculating the error correction code for the page, said calculating comprising determining whether to use an actual value of a word in said calculating based on the state of the guard value corresponding to the word.

2. The method of claim 1, further comprising storing the plurality of guard values into a plurality of guard fields.

3. The method of claim 1, further comprising setting the guard values of the plurality of guard values.

4. The method of claim 3, wherein setting the guard values of the plurality of guard values comprises basing the guard values at least in part on whether the corresponding word includes multilevel content or single-level content.

5. The method of claim 1, wherein the at least two states comprises at least a first state and a second state, and determining whether to use the actual value of a word comprises using actual values of the words having corresponding guard values in the first state and not using actual values of the words not having corresponding guard values in the first state.

6. The method of claim 5, wherein said calculating comprises using mask values for the words not having corresponding guard values in the first state.

7. The method of claim 5, further comprising independently updating the actual values of the words not having corresponding guard values in the first state.

8. The method of claim 1, wherein the at least two states comprises at least a first state and a second state, and determining whether to use the actual value of a word comprises using actual values of the words not having corresponding guard values in the second state and not using actual values of the words having corresponding guard values in the second state.

9. The method of claim 8, wherein said calculating comprises using mask values for the words having corresponding guard values in the second state.

10. The method of claim 8, further comprising independently updating the actual values of the words having corresponding guard values in the second state.

11. An apparatus comprising:
- a memory comprising a plurality of pages configured to store data as a plurality of words, each word containing a corresponding actual value and having a corresponding guard value in one of at least two states; and
- a controller coupled to the memory, the controller configured to calculate an error correction code for a page of the plurality of pages and to determine whether to use an actual value of a word of the page in calculating the error correction code based at least in part on a state of the guard value corresponding to the word.

12. The apparatus of claim 11, wherein the at least two states comprises at least a first state and a second state, and the controller is further configured to use the actual values of the words having corresponding guard values in the first state and to not use the actual values of the words not having corresponding guard values in the first state.

13. The apparatus of claim 12, wherein the controller is further configured to calculate the error correction code for the page by using mask values for the words not having corresponding guard values in the first state.

14. The apparatus of claim 12, wherein the controller is further configured to independently update data stored in one or more words not having corresponding guard values in the first state.

15. The apparatus of claim 11, wherein the at least two states comprises at least a first state and a second state, and the controller is further configured to use the actual values of the words not having corresponding guard values in the second state and to not use the actual values of the words having corresponding guard values in the second state.

16. The apparatus of claim 15, wherein the controller is further configured to calculate the error correction code for the page by using mask values for the words having corresponding guard values in the second state.

17. The apparatus of claim 15, wherein the controller is further configured to independently update data stored in one or more words having corresponding guard values in the second state.

18. The apparatus of claim 11, wherein the controller comprises:
- word logic configured to store the data as the plurality of words; and
- error correction code logic configured to calculate the error correction code.

19. The apparatus of claim 11, wherein the controller comprises guard logic configured to store the plurality of guard values into a plurality of guard fields corresponding to the plurality of words.

20. The apparatus of claim 19, wherein the guard logic is configured to set each guard value into one of the at least two states based at least in part on whether the corresponding word includes multilevel content or single-level content.

21. The apparatus of claim 11, further comprising:
- a word sense amplifier (SA) configured to read the plurality of words;
- a guard SA configured to read the guard values; and
- an error correction code SA configured to read the error correction code.

22. The apparatus of claim 21, further comprising:
- a register configured to store a mask value; and
- a selector coupled to the register, the word SA, and the guard SA, and configured to output an actual value for a word received from the word SA or the mask value received from the register, based at least in part on a guard value received from the guard SA.

23. A controller configured to:
- store a plurality of words on the page, each word of the plurality of words containing a corresponding actual value and having a corresponding guard value in one of at least two states; and
- calculate the error correction code for the page, the error correction code dependent on words of the plurality of words selected to be used based on the states of the guard values corresponding to the words.

24. The controller of claim 23, further configured to set each guard value into one of the at least two states based at least in part on whether the corresponding word includes multilevel content or single-level content.

25. The controller of claim 23, wherein the error correction code is calculated by using mask values for words that are not selected to be used.

26. The controller of claim 23, further configured to independently update data stored in one or more words that are not selected to be used.

* * * * *